(12) United States Patent
Nakao et al.

(10) Patent No.: US 8,470,720 B2
(45) Date of Patent: Jun. 25, 2013

(54) FILM FORMING APPARATUS AND FILM FORMING METHOD

(75) Inventors: Ken Nakao, Nirasaki (JP); Muneo Harada, Nirasaki (JP)

(73) Assignee: Tokyo Electron Limited (JP)

( * ) Notice: Subject to any disclaimer, the term of this patent is extended or adjusted under 35 U.S.C. 154(b) by 144 days.

(21) Appl. No.: 12/934,165

(22) PCT Filed: Mar. 16, 2009

(86) PCT No.: PCT/JP2009/055034
§ 371 (c)(1),
(2), (4) Date: Sep. 23, 2010

(87) PCT Pub. No.: WO2009/119365
PCT Pub. Date: Oct. 1, 2009

(65) Prior Publication Data
US 2011/0039420 A1 Feb. 17, 2011

(30) Foreign Application Priority Data
Mar. 25, 2008 (JP) .................................. 2008-078814

(51) Int. Cl.
*H01L 21/31* (2006.01)
*H01L 21/469* (2006.01)

(52) U.S. Cl.
USPC ....... 438/780; 438/781; 438/99; 257/E21.299

(58) Field of Classification Search
USPC .......................................... 438/99, 780, 781
See application file for complete search history.

(56) References Cited

U.S. PATENT DOCUMENTS

| 6,709,715 B1 * | 3/2004 | Lang et al. ................... 427/489 |
| 2003/0049372 A1 * | 3/2003 | Cook et al. ................. 427/248.1 |
| 2005/0282987 A1 * | 12/2005 | Kawahara et al. ............ 526/279 |

FOREIGN PATENT DOCUMENTS

| JP | 04045259 A | * | 2/1992 |
| JP | 06-310454 | | 11/1994 |
| JP | 09-321064 | | 12/1997 |
| JP | 09-330884 | | 12/1997 |
| JP | 2001-110730 | | 4/2001 |
| JP | 2001-207254 | | 7/2001 |
| JP | 3758696 | | 3/2006 |

OTHER PUBLICATIONS

International Search Report—PCT/JP2009/055034 dated Apr. 21, 2009.

* cited by examiner

*Primary Examiner* — Jarrett Stark
(74) *Attorney, Agent, or Firm* — Cantor Colburn LLP (57) ABSTRACT

A wall surface of a film forming container is heated to or above a vaporization temperature of a material monomer, which is used to form an organic film, by using an external heater formed along the wall surface of the film forming container, substrates are heated to a thermal polymerization reaction temperature by using an internal heater that is disposed apart from the external heater and near a substrate-supporting container in which the substrates are received, and the organic film is formed through thermal polymerization occurring on the substrates by supplying the material monomer into the film forming container.

7 Claims, 7 Drawing Sheets

(a) SUPPLY·ADHESION OF FIRST MATERIAL MONOMER (b) SUPPLY·ADHESION OF SECOND MATERIAL MONOMER

(c) REPETITION OF (a) AND (b)

(d) CURE

FIG. 7

FILM FORMING APPARATUS AND FILM FORMING METHOD

TECHNICAL FIELD

The present invention relates to a film forming apparatus and a film forming method, and more particularly, to a film forming apparatus and a film forming method suitable for forming of an organic film through a thermal polymerization reaction.

BACKGROUND ART

A polymer organic film may be used as an interlayer insulating film of LSI or the like or a liquid crystal alignment film, and has very excellent electrical, optical, and mechanical characteristics. In particular, since, for example, polyimide or the like has a high glass transition point and has excellent heat resistance, chemical stability, alignment control, and the like, polyimide or the like is used as a heat- and radiation-resistant material and a space-survival material, and is also being considered to be used as an insulating material of a superconducting magnet used in a fusion reactor, a protective material for preventing degradation of a material for machinery due to atomic oxygen in space, or the like.

As a method for obtaining such a polymer organic film, a conventional method of polymerizing a monomer by using a solvent to obtain a solution and coating the solution on a substrate is known. However, since the conventional method uses the solvent, impurity introduction or the like occurs and it is difficult to obtain a thin film having a uniform thickness less than 1000 Å. Also, as a method for obtaining a monomolecular layer film, manufacture of a thin film using a Langmuir-Blodgett (LB) method has been studied. However, since reactions, such as substitution of hydrophilic and hydrophobic groups and the like, are complicated and, it is difficult to control a surface pressure required when the thin film is obtained, it is difficult to obtain a thin film with a large area. Also, since a solvent is used during polymerization or the like, impurity introduction occurs as well.

Meanwhile, contrary to such a wet process, a deposition polymerization method (vacuum deposition polymerization method) for directly obtaining an organic film by vaporizing a material monomer in a vacuum bath and polymerizing the vaporized material monomer on a substrate has been suggested. Since this method is a dry process under a non-thermal equilibrium state, an organic film that may not be obtained in a conventional chemical wet process may be obtained. Since the material monomer is introduced into and adhered to a protrusion/recess portion of the substrate, this method may form a film with good coverage (Patent document 1).

(Patent document 1) Specification of Japanese Patent Publication No. 3758696

However, the deposition polymerization method introduces the material monomer into a film forming container in a state where the film forming container itself is heated to the same temperature as that at which the material monomer reacts in a gas state. Accordingly, a thermal polymerization reaction of the material monomer occurs not only on the substrate but also on a wall surface of the film forming container, and as a result, a desired organic film is formed not only on the substrate but also on the wall surface of the film forming container.

The organic film formed on the wall surface of the film forming container is detached from the wall surface to become particles, and the particles are mixed in the organic film formed on the substrate, thereby degrading a film quality and reducing a manufacturing yield. Also, since the thermal polymerization reaction occurs not only on the target substrate but also occurs on the wall surface of the film forming container, the use efficiency of the material monomer is reduced.

DISCLOSURE OF THE INVENTION

Technical Problem

The present invention is proposed considering the aforesaid problems. According to the present invention, it may be obtained to suppress the formation of an organic film on a wall surface of a film forming container by suppressing a thermal polymerization reaction on the wall surface of the film forming container, to reduce the quality degradation and the manufacturing yield drop of a desired organic film due to the generation of particles, and to improve the use efficiency of a material monomer.

Technical Solution

According to the present invention, there is provided a film forming apparatus including: a substrate-supporting container which supports a plurality of substrates to be spaced apart from one another; a film forming container in which the substrate-supporting container is received, and which supplies a material monomer to the plurality of substrates and is used to form an organic film through thermal polymerization; a supplier of the material monomer, which is formed in the film forming container; an external heater which is formed along a wall surface of the film forming container; and an internal heater which is disposed apart from the external heater and near to the substrate-supporting container, wherein the external heater heats the wall surface of the film forming container to or above a vaporization temperature of the material monomer, and the internal heater heats the substrates to a thermal polymerization reaction temperature of the material monomer.

Also, according to the present invention, there is provided a film forming method including: supporting a plurality of substrates to be spaced apart from one another in a substrate-supporting container received in a film forming container; heating a wall surface of the film forming container to or above a vaporization temperature of a material monomer, which is to be provided to form an organic film, by using an external heater formed along the wall surface of the film forming container; heating the substrates to a thermal polymerization reaction temperature of the material monomer by using an internal heater that is disposed apart from the external heater and near to the substrate-supporting container; and forming the organic film through thermal polymerization occurring on the substrates by supplying the material monomer into the film forming container from a supplier formed in the film forming container.

According to the present invention, an external heater is formed along a wall surface of a film forming container for forming an organic film, and an internal heater is formed near a substrate-supporting container received in the film forming container. The wall surface of the film forming container is heated by the external heater to or above a vaporization temperature of a material monomer, and substrates are heated by the internal heater to a thermal polymerization temperature of the material monomer. Accordingly, when the material monomer is introduced into the film forming container, the material monomer is adhered only onto the substrates of the substrate-supporting container, without being adhered to the wall surface of the film forming container to cause a thermal polymerization reaction on the wall surface, thereby forming a desired organic film by causing a thermal polymerization reaction on the substrate.

As a result, since the organic film is not formed on the wall surface of the film forming container, the organic film is prevented from being detached from the wall surface to become particles, and thus from degrading a film quality due to the particles' mixing in the organic film formed on the substrates and from reducing a manufacturing yield. Also, since the material monomer supplied is used to form the organic film only on the substrate, the use efficiency of the material monomer is improved.

Also, in one embodiment of the present invention, a space between the external heater and the internal heater is held at a depressurized state. Accordingly, since thermal insulation effect between the external heater and the internal heater is increased and temperature interference between the external heater and the internal heater is suppressed, for example, heat radiation due to the external heater may be prevented from affecting the substrates held in the substrate-supporting container, and thus the thermal polymerization reaction occurring on the substrates may be prevented from being impeded.

Also, in one embodiment of the present invention, a heating gas is flown between the external heater and the internal heater. Accordingly, a radiant heat from the internal heater may be efficiently transferred to the substrates in the substrate-supporting container. At this time, if the heating gas is heated to the thermal polymerization reaction temperature, the thermal polymerization reaction of the material monomer on the substrates may be assisted.

Also, in one embodiment of the present invention, the substrate may include a substrate for forming an organic film, and a support substrate attached to a rear surface of the substrate for forming the organic film. In this case, since the support substrate is attached to the rear surface side of the substrate, that is, to the rear surface side of the substrate for forming the organic film, the organic film is not formed on the rear surface side of the substrate, specifically, on the rear surface side of the substrate for forming the organic film. Accordingly, the organic film may be formed only on a surface of the substrate, that is, only on a surface of the substrate for forming the organic film.

Also, in one embodiment of the present invention, the supplier may include a first gas introduction pipe which is a straight pipe erected upward from a downside and having a closed front end, and which includes gas ejection holes, through which the material monomer is ejected, formed at predetermined intervals in a pipe wall of the first gas introduction pipe, and a second gas introduction pipe which is a U-shaped pipe bent downward from an upside and having a front end closed, and which includes gas ejection holes, through which the material monomer is ejected, formed at predetermined intervals in a pipe wall of a portion bent downward in the second gas introduction pipe. In this case, the amount of the material monomer supplied onto the substrates received in the substrate-supporting container may be uniform, thereby suppressing a change in the characteristics of the organic film formed on the surfaces of the substrates.

Also, in one embodiment of the present invention, the organic film may be used as a through via insulating film in a semiconductor integrated circuit.

Advantageous Effects

As described above, according to the present invention, the formation of an organic film on a wall surface of a film forming container may be suppressed by suppressing a thermal polymerization reaction on the wall surface of the film forming container, and thus quality degradation and manufacturing yield drop of an organic film due to the generation of particles may be reduced, and the use efficiency of a material monomer may be improved.

BEST MODE FOR CARRYING OUT THE INVENTION

Hereinafter, specific features of the present invention will be explained based on best modes for carrying the invention.

(Embodiment 1)

Figure 1:
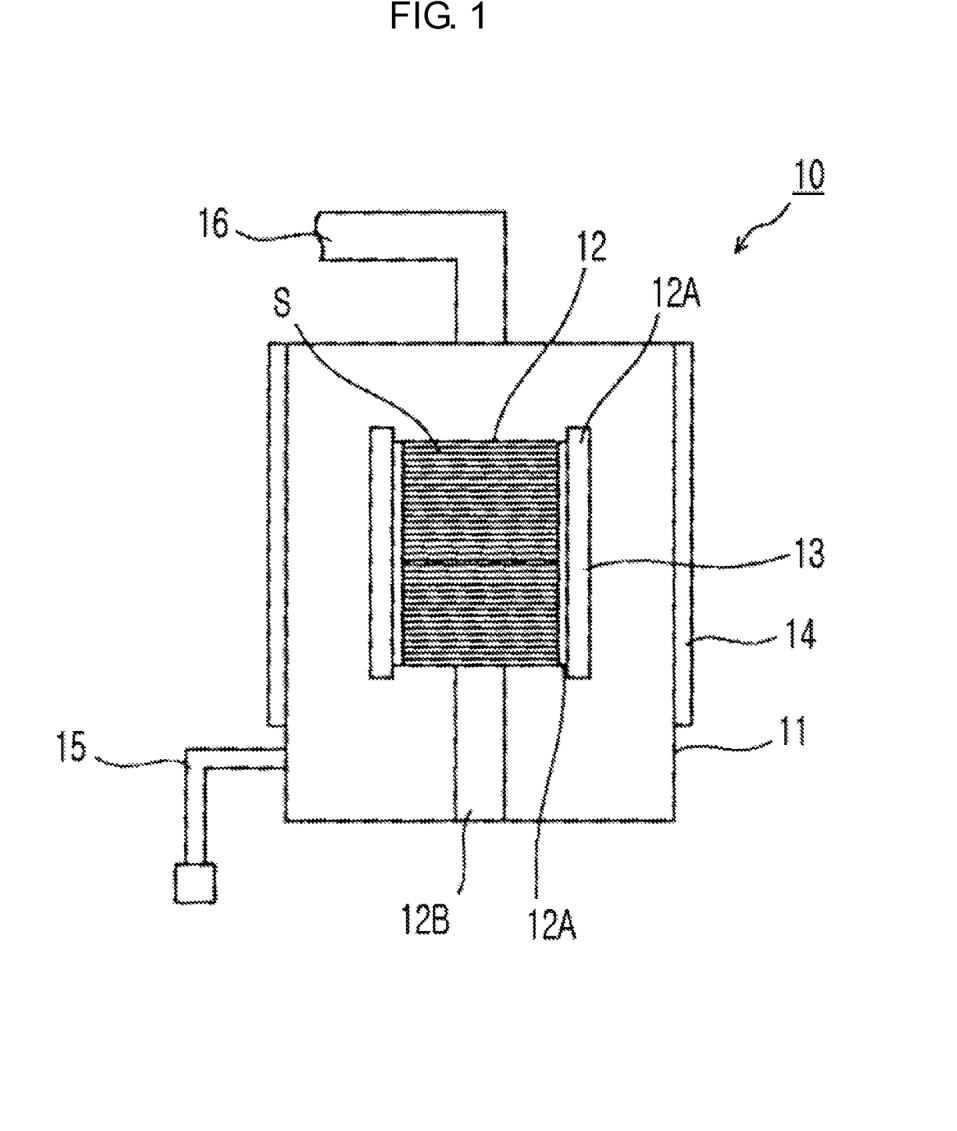
FIG. 1 is a view schematically showing an example of a configuration of a film forming apparatus according to the present invention.

FIG. 1 is a view schematically showing an example of a configuration of a film forming apparatus according to the present invention.

In a film forming apparatus 10 shown in FIG. 1, a boat 12 is received as a substrate-supporting container in a film forming container 11, and is fixed to a bottom surface of the film forming container 11 by a support member 12B formed at a lower portion of the film forming container 11. Also, a support member 12A protrudes in a horizontal direction from upper and lower ends of the boat 12, and an internal heater 13 is formed to be engaged to the support member 12A. Also, an external heater 14 is formed along a wall surface of an outer wall of the film forming container 11. Also, a supply pipe 15 of a material monomer is formed at the lower portion of the film forming container 11.

Also, an exhaust pipe 16, which is connected to an exhaust system (not shown) and through which the film forming container 11 is exhausted to a depressurized state, is formed at an upper portion of the film forming container 11. Also, a plurality of substrates S are horizontally supported in the boat 12 to be spaced apart from one another.

As clearly found from FIG. 1, in the film forming apparatus 10 of the present embodiment, the internal heater 13 is disposed near the boat 12, and sets a temperature of each of the substrates S received in the boat 12 to a thermal polymerization reaction temperature of the material monomer to be supplied into the film forming container 11. Also, the external heater 14 is formed along the outer wall of the film forming container 11, and heats the wall surface of the film forming container 11 to or above a vaporization temperature of the material monomer. Accordingly, when the material monomer is introduced into the film forming container 11, the material monomer is adhered only to the substrates S received in the boat 12, without being adhered to the wall surface of the film forming container 11 to cause a thermal polymerization reaction on the wall surface, thereby forming a desired organic film by causing a thermal polymerization reaction on the substrates S.

As a result, since the organic film is not formed on the wall surface of the film forming container 11, the organic film is prevented from being detached from the wall surface to become particles, and thus from degrading a film quality due to the particles' mixing in the organic film formed on the substrates S and from reducing a manufacturing yield. Also, since the material monomer supplied is used to form the organic film only on the substrates S, the use efficiency of the material monomer is improved.

Also, in the present embodiment, since the film forming container 11 is exhausted to the depressurized state by the exhaust system (not shown) through the exhaust pipe 16, a space between the external heater 14 and the internal heater 13 is held at a depressurized state. Accordingly, thermal insulation effect between the external heater 14 and the internal heater 13 is increased, thereby suppressing temperature interference between the external heater 14 and the internal heater 13.

As described above, since the internal heater 13 heats the substrates S to the thermal polymerization reaction temperature of the material monomer supplied into the film forming container 11, and the external heater 14 heats the wall surface of the film forming container 11 to or above the vaporization temperature of the material monomer, a heating temperature of the external heater 14 is higher than a heating temperature of the internal heater 13. In this regard, since thermal insulation effect between the external heater 14 and the internal heater 13 is increased as described above, and thus particularly, a radiant heat from the external heater 14 is suppressed, the substrates S are prevented from being heated to or above the thermal polymerization reaction temperature to cause disadvantages such as hindrance of the formation of the organic film.

However, even though the space between the external heater 14 and the internal heater 13 is not held at a depressurized state, the same operational effect as that obtained when the space is held at the depressurized state may be obtained by disposing the external heater 14 apart from the internal heater 13, that is, from the boat 12, or by adjusting the thickness of a wall of the film forming container 11, or the like.

Also, particularly in case that a polyimide film is formed as the organic film, and pyromellitic dianhydride and oxydianiline are used as the material monomer, the wall surface of the film forming container 11 is heated by the external heater 14 to a temperature, for example, 260° C., and the substrates S are heated by the internal heater 13 to a thermal polymerization reaction temperature, for example, 200° C.

Also, in the present embodiment, the substrate S may include a substrate for forming the organic film and a support substrate attached to a rear surface of the substrate for forming the organic film. In this case, since the support substrate is attached on the rear surface side of the substrate S, that is, on the rear surface side of the substrate for forming the organic film, the organic film is not formed on the rear surface side of the substrate S, specifically, on the rear surface side of the substrate for forming the organic film. Accordingly, the organic film may be formed only on the desired surface of the substrate S, that is, on the surface of substrate for forming the organic film.

Next, a film forming method using the film forming apparatus shown in FIG. 1 will be briefly explained.

First, the boat 12 which supports the plurality of substrates S in the horizontal direction to be spaced apart from one another is received in the film forming container 11. Next, the wall surface of the film forming container 11 is heated by the external heater 14 to or above a vaporization temperature of the material monomer, and the substrates S are heated by the internal heater 13 to a thermal polymerization reaction temperature of the material monomer. Next, the material monomer is supplied into the film forming container 11 from the supply pipe 15 formed in the film forming container 11, to form a desired organic film through thermal polymerization on the substrates S.

According to the present invention, as described above, when the material monomer is introduced into the film forming container 11, the material monomer is adhered only to the substrates S received in the boat 12, without being adhered to the wall surface of the film forming container 11 to cause a thermal polymerization reaction on the wall surface, thereby forming a desired organic film by causing a thermal polymerization reaction on the substrates S.

As a result, since the organic film is not formed on the wall surface of the film forming container 11, the organic film is prevented from being detached from the wall surface to become particles, and thus from degrading a film quality due to the particles' mixing in the organic film formed on the substrates S and from reducing a manufacturing yield. Also, since the material monomer supplied is used to form the organic film only on the substrates S, the use efficiency of the material monomer is improved.

(Embodiment 2)

Figure 2:
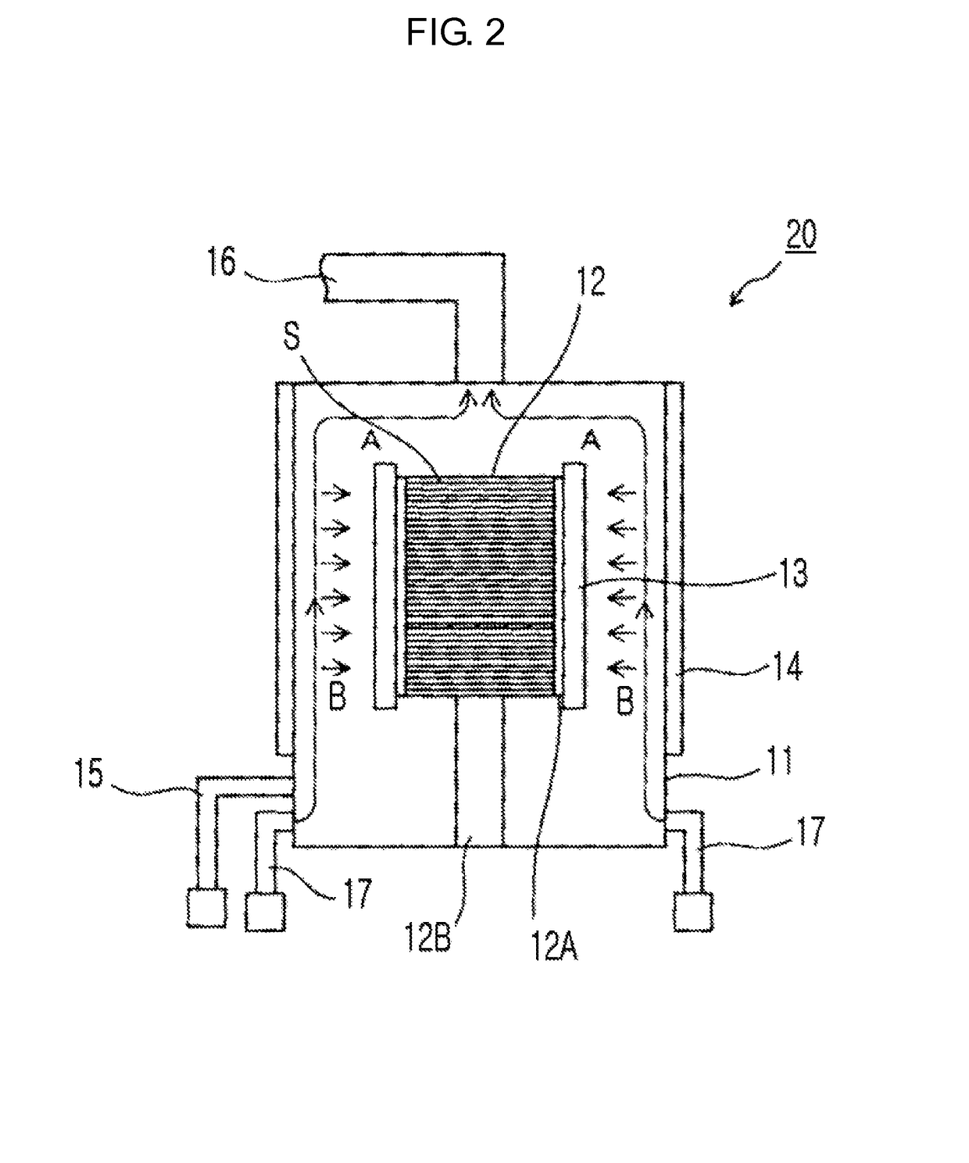
FIG. 2 is a view schematically showing another example of a configuration of a film forming apparatus according to the present invention.

FIG. 2 is a view schematically showing another example of a configuration of a film forming apparatus according to the present invention. Also, the same or similar elements as or to those of the film forming apparatus 10 shown in FIG. 1 will be denoted by the same reference numerals.

In a film forming apparatus 20 shown in FIG. 2, the boat 12 is received as a substrate-supporting container in the film forming container 11, and is fixed to a bottom surface of the film forming container 11 by the support member 12B formed at a lower portion of the film forming container 11. Also, the support member 12A protrudes in a horizontal direction from upper and lower ends of the boat 12, and the internal heater 13 is formed to be engaged to the support member 12A. Also, the external heater 14 is formed along a wall surface of an outer wall of the film forming container 11. Also, the supply pipe 15 of a material monomer and a supply pipe 17 of a heating gas are formed at the lower portion of the film forming container 11.

Also, an exhaust pipe 16, which is connected to an exhaust system (not shown) and through which the film forming container 11 is exhausted, is formed at an upper portion of the film forming container 11. Also, the plurality of substrates S are horizontally supported in the boat 12 to be spaced apart from one another.

As clearly found from FIG. 2, even in the film forming apparatus 20 of the present embodiment, the internal heater 13 is disposed near the boat 12, and sets a temperature of the substrates S received in the boat 12 to a thermal polymerization temperature of a material monomer to be supplied into the film forming container 11. Also, the external heater 14 is formed along the outer wall of the film forming container 11, and heats the wall surface of the film forming container 11 to or above a vaporization temperature of the material monomer. Accordingly, when the material monomer is introduced into the film forming container 11, the material monomer is adhered only to the substrates S received in the boat 12, without being adhered to the wall surface of the film forming container 11 to cause a thermal polymerization reaction on the wall surface, thereby forming a desired organic film by causing a thermal polymerization reaction on the substrates S.

As a result, since the organic film is not formed on the wall surface of the film forming container 11, the organic film is prevented from being detached from the wall surface to become particles, and thus from degrading a film quality due to the particles' mixing in the organic film formed on the substrates S and from reducing a manufacturing yield. Also, since the material monomer supplied is used to form the organic film only on the substrates S, the use efficiency of the material monomer is improved.

Also, in the present embodiment, the film forming container 11 is exhausted by the exhaust system (not shown) through the exhaust pipe 16. Accordingly, a heating gas supplied from the supply pipe 17 flows upward from the downside of the film forming container 11 as shown by arrow A in FIG. 2 while being supplied to the substrates S in the boat 12, as shown by arrow B in FIG. 2. As a result, a radiant heat from the internal heater 13 may be efficiently transferred to the substrates S in the boat 12. At this time, if the heating gas is heated to the thermal polymerization reaction temperature, a thermal polymerization reaction of the material monomer on the substrates S may be assisted.

The heating gas may be a non-reactive gas, for example, an inert gas, a nitrogen gas, or the like.

Also, like the heating gas, the material monomer supplied from the supply pipe 15 also flows upward from the downside of the film forming container 11 while being supplied to surfaces of the substrates S by operating an exhaust of the film forming container 11 through the exhaust pipe 16 so as to assist the aforesaid thermal polymerization reaction.

Also, other conditions and the like, and a film forming method using the film forming apparatus 20 are the same as those in the embodiment 1, and thus an explanation thereof will not be given.

(Embodiment 3)

Figure 3:
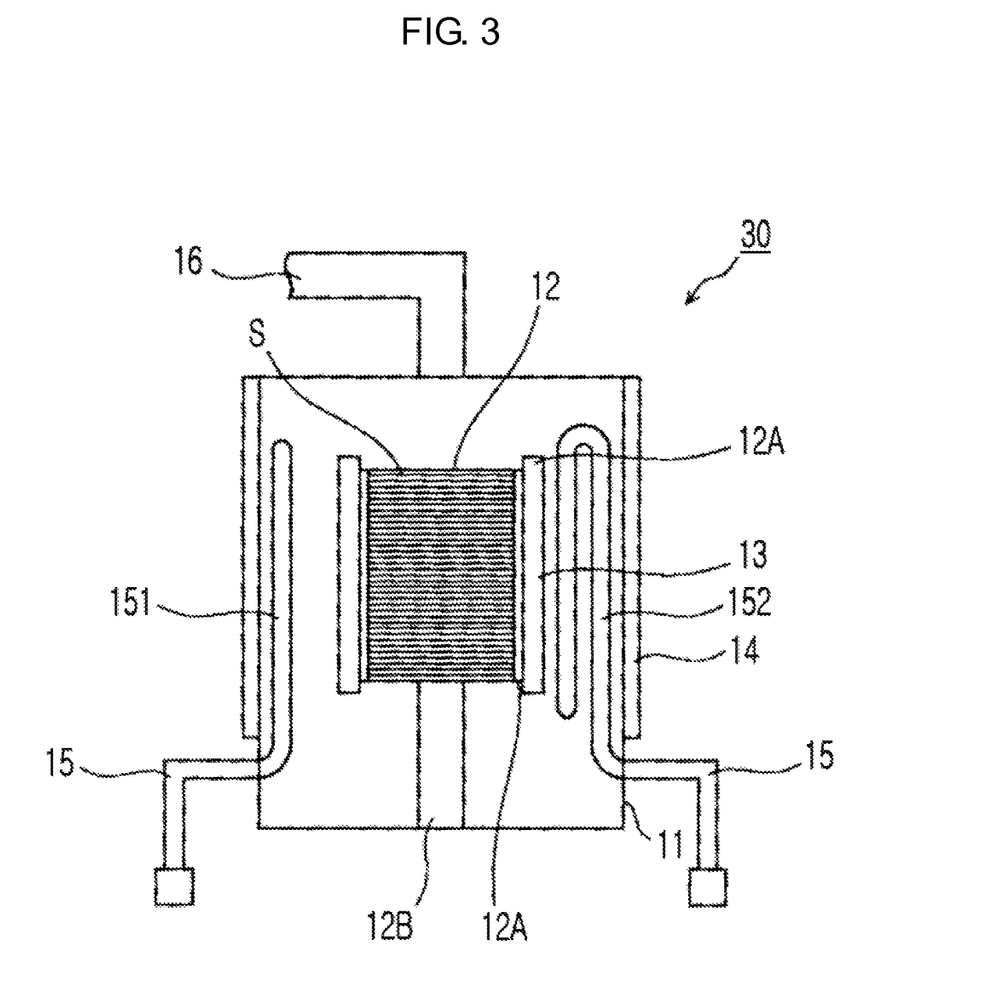
FIG. 3 is a view schematically showing yet another example of a configuration of a film forming apparatus according to the present invention.
Figure 4:
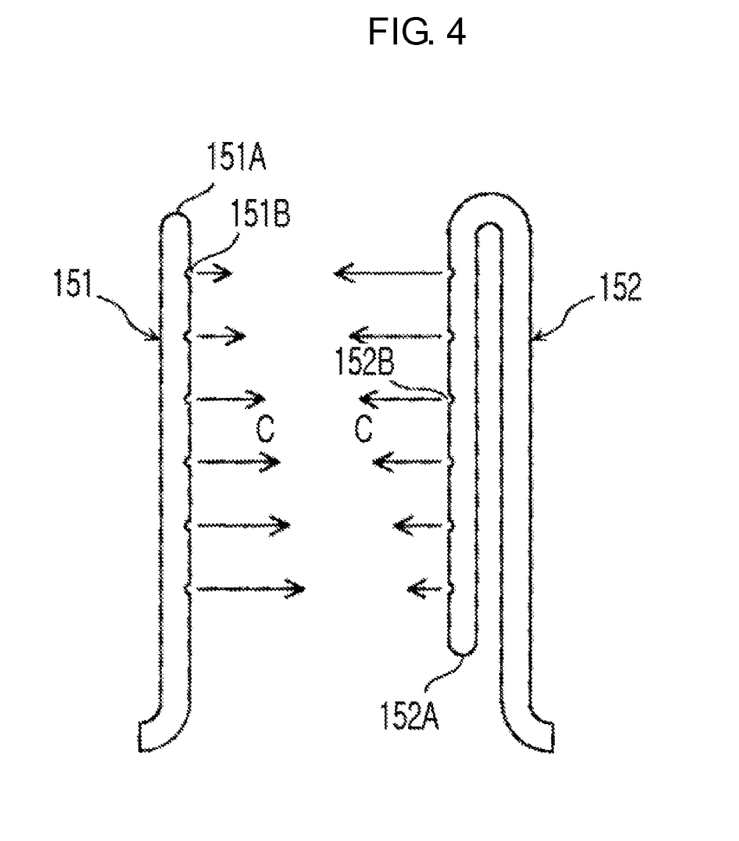
FIG. 4 is a view schematically showing a configuration of a gas introduction pipe used in the film forming apparatus shown in FIG. 3.

FIG. 3 is a view schematically showing yet another example of a configuration of a film forming apparatus according to the present invention. FIG. 4 is a view schematically showing a configuration of a gas introduction pipe used in the film forming apparatus shown in FIG. 3. Also, the same or similar elements as or to those of the film forming apparatus 10 shown in FIG. 1 are denoted by the same reference numerals.

In a film forming apparatus 30 shown in FIG. 3, the boat 12 is received as a substrate-supporting container in the film forming container 11, and is fixed to a bottom surface of the film forming container 11 by the support member 12B formed at a lower portion of the film forming container 11. Also, the support member 12A protrudes in a horizontal direction from upper and lower ends of the boat 12, and the internal heater 13 is formed to be engaged to the support member 12A. Also, the external heater 14 is formed along a wall surface of an outer wall of the film forming container 11. Also, the supply pipe 15 of a material monomer is formed at the lower portion of the film forming container 11. Also, the plurality of substrates S are horizontally supported in the boat 12 to be spaced apart from one another.

Also, a first gas introduction pipe 151 that is a straight pipe formed of, for example, quartz, erected upward from the downside along a side surface of the boat 12, and having a closed front end 151A, is connected to one side of the supply pipe 15. A second gas introduction pipe 152 that is a U-shaped pipe formed of, for example, quartz, erected upward from the downside and then bent downward from the upside along the side surface of the boat 12, and having a closed front end 152A is connected to another side of the supply pipe 15. Also, gas ejection holes 151B and 152B, through which the material monomer supplied from the supply pipe 15 is ejected, are respectively formed in the first gas introduction pipe 151 and the second gas introduction pipe 152, at almost the same intervals as pitches of the substrates S arranged in the boat 12.

The exhaust pipe 16, which is connected to an exhaust system (not shown) and through which the film forming container 11 is exhausted, is formed at an upper portion of the film forming container 11.

As clearly found from FIG. 3, even in the film forming apparatus 30 of the present embodiment, the internal heater 13 is disposed near the boat 12, and sets a temperature of the substrates S received in the boat 12 to a thermal polymerization reaction temperature of the material monomer to be supplied into the film forming container 11. Also, the external heater 14 is formed along the outer wall of the film forming container 11, and heats the wall surface of the film forming container 11 to or above a vaporization temperature of the material monomer. Accordingly, when the material monomer is introduced into the film forming container 11, the material monomer is adhered only to the substrates S received in the boat 12, without being adhered to the wall surface of the film forming container 11 to cause a thermal polymerization reaction on the wall surface, thereby forming a desired organic film by causing a thermal polymerization reaction on the substrates S.

As a result, since the organic film is not formed on the wall surface of the film forming container 11, the organic film is prevented from being detached from the wall surface to become particles, and thus from degrading a film quality due to the particles' mixing in the organic film formed on the substrates S and from reducing a manufacturing yield. Also, since the material monomer supplied is used to form the organic film only on the substrates S, the use efficiency of the material monomer is improved.

Also, in the present embodiment, since the first gas introduction pipe 151 and the second gas introduction pipe 152 are provided as described above, the material monomer is supplied almost in parallel to surfaces of the substrates S received in the boat 12 from the gas ejection holes 151B and 152B respectively formed in the first gas introduction pipe 151 and the second gas introduction pipe 152 (shown by arrow C of FIG. 4). Also, the amount of the material monomer ejected from the gas ejection holes 151B decreases as going upward in case of the first gas introduction pipe 151 that is the straight pipe, whereas the amount of the material monomer ejected from the gas ejection holes 152B decreases as going downward in case of the second gas introduction pipe 152 that is the U-shaped pipe.

Accordingly, since the first gas introduction pipe 151 and the second gas introduction pipe 152 are used in combination, the supply amount of the material monomer may be uniform in an in-plane direction of the substrates S in the boat 12. As a result, a change in the characteristics, such as a change in the thickness or the like, of the organic film formed on the surfaces of the substrates S may be suppressed.

Also, even in the present embodiment, the film forming container 11 may be exhausted to a depressurized state by the exhaust system (not shown) through the exhaust pipe 16. In this case, in the same manner as that described above, thermal insulation effect between the external heater 14 and the internal heater 13 is increased, thereby suppressing temperature interference between the external heater 14 and the internal heater 13. Accordingly, since particularly a radiant heat from the external heater 14 is suppressed, the substrates S are prevented from being heated to or above the thermal polymerization reaction temperature to cause disadvantages such as a hindrance of the formation of the organic film.

Also, the supply pipe 17 may be separately formed to supply a heating gas therefrom into the film forming container 11. In this case, a radiant heat from the internal heater 13 may be efficiently transferred to the substrates S in the boat 12. At this time, if the heating gas is heated to the thermal polymerization reaction temperature, a thermal polymerization reaction of the material monomer on the substrates S may be assisted.

(Embodiment 4)

Figure 5:
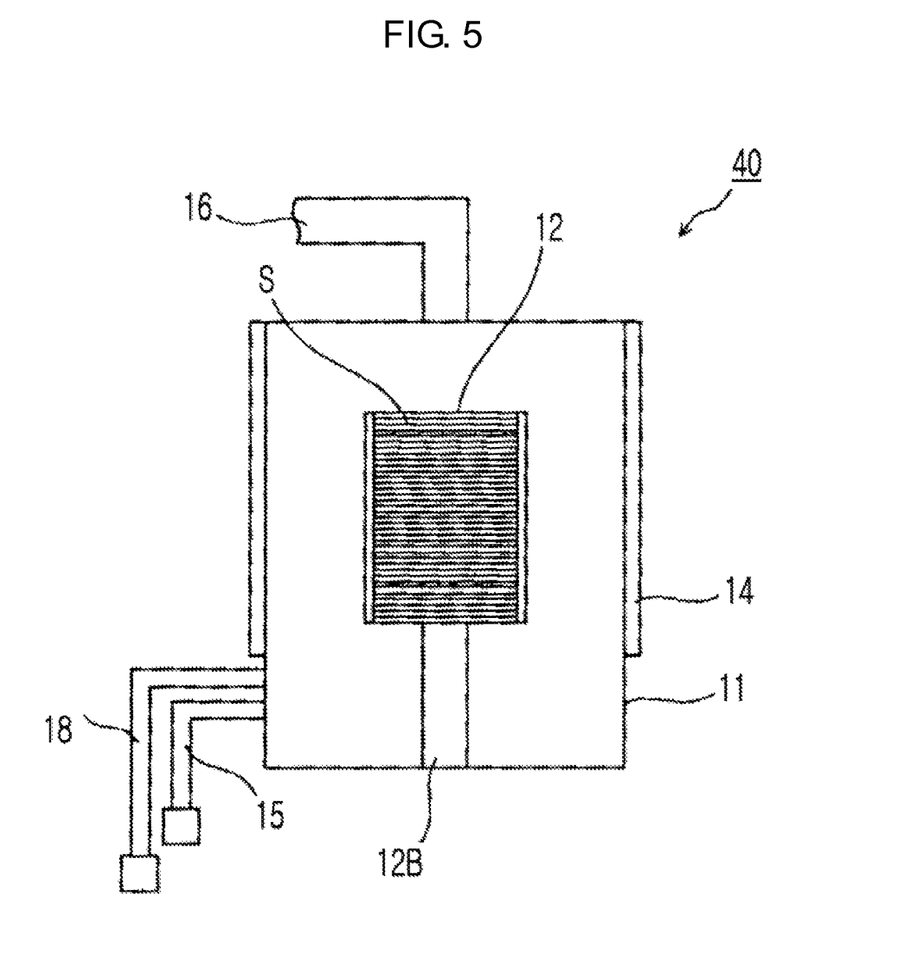
FIG. 5 is a view schematically showing a configuration of a film forming apparatus used in an embodiment of the present invention.
Figure 6:
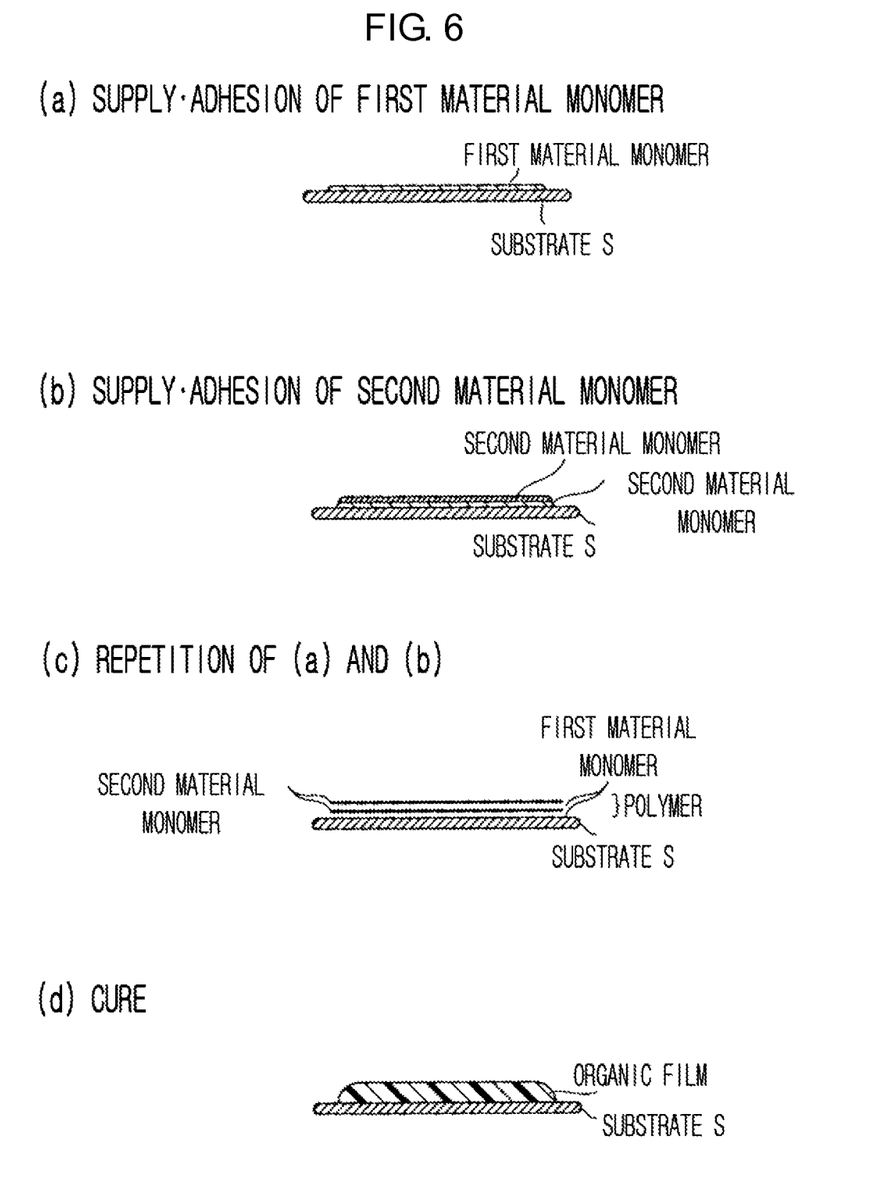
FIG. 6 is a view schematically showing processes of a film forming method used in the embodiment of the present invention.

FIG. 5 is a view schematically showing a configuration of a film forming apparatus used in the present embodiment. FIG. 6 is a view schematically showing processes of a film forming method in the present embodiment.

In a film forming apparatus 40 shown in FIG. 5, the boat 12 is received as a substrate-supporting container in the film forming container 11, and is fixed to a bottom surface of the film forming container 11 by the support member 12B formed at a lower portion of the film forming container 11. Also, the external heater 14 is formed along a wall surface of an outer wall of the film forming container 11. Also, the supply pipe 15 of a material monomer and an additional supply pipe 18 are formed at a lower portion of the film forming container 11.

Also, the exhaust pipe 16, which is connected to an exhaust system (not shown) and through which the film forming container is exhausted, is formed at an upper portion of the film forming container 11. Also, the plurality of substrates S are horizontally supported in the boat 12 to be spaced apart from one another.

Next, a film forming method of the present embodiment will be explained. First, the wall surface of the film forming container 11 is heated by the external heater 14 to or above a vaporization temperature of the material monomer to be supplied. Meanwhile, the boat 12 in which the substrates S are received is held at a low temperature at which the material monomer is not vaporized, for example, at a room temperature (about 25° C.).

In this state, a first material monomer is introduced into the film forming container 11 for a predetermined period of time from the supply pipe 15. Next, the inside of the film forming container 11 is vacuum-sucked or purged by using an $N_2$ gas or the like from the exhaust pipe 16, to prevent part of the material monomer from remaining in the film forming container 11. Then, since the boat 12, that is, the substrates S, are held at the room temperature as described above, the first material monomer is selectively adhered onto the substrates S, as shown in FIG. 6(a).

Next, a second material monomer is introduced into the film forming container 11 for a predetermined period of time from the additional supply pipe 18. Next, the inside of the film forming container 11 is vacuum-sucked or purged by using an $N_2$ gas or the like from the exhaust pipe 16, to prevent part of the material monomer from remaining in the film forming container 11. Then, since the boat 12, that is, the substrates S, are held at the room temperature as described above, the second material monomer is selectively adhered onto the first material monomer adhered onto the substrates S, thereby inducing a surface stress, as shown in FIG. 6(b).

Next, the first material monomer and the second material monomer are adhered to each other by repeating the aforesaid operations, to cause a surface reaction and thus to form a predetermined polymerized film (refer to FIG. 6(c)). Next, the boat 12 is heated to a predetermined temperature, to cause a thermal polymerization reaction on the polymerization film and thus to form a desired organic film on the substrates S (refer to FIG. 6(d)).

In the present embodiment, since the wall surface of the film forming container 11 is heated to or above a vaporization temperature of the material monomer and the boat 12, that is, the substrates S, are held at a temperature less than the vaporization temperature, for example, at a room temperature, the material monomer is adhered only onto the substrates S received in the boat 12, without being adhered onto the wall surface of the film forming container 11 to cause a thermal polymerization reaction on the wall surface, thereby forming a desired organic film by causing a thermal polymerization reaction on the substrates S.

As a result, since the organic film is not formed on the wall surface of the film forming container 11, the organic film is prevented from being detached from the wall surface to become particles, and thus from degrading a film quality due to the particles' mixing in the organic film formed on the substrates S and from reducing a manufacturing yield. Also, since the material monomer supplied is used to form the organic film only on the substrates S, the use efficiency of the material monomer is improved.

Also, since the material monomers are alternately adhered onto the substrates S, and then a desired organic film is obtained through a surface reaction and a thermal polymerization reaction, a change in the characteristics of the organic film due to the irregular supply of the material monomers may be suppressed, when compared to a case where thermal polymerization reactions are simultaneously caused while material monomers are supplied, to form the organic film.

For example, if a polyimide film is formed as the organic film, oxydianiline (as the first material monomer) and pyromellitic dianhydride (as the second material monomer) are used. At this time, a temperature of the wall surface of the film forming container 11 is, for example, 260° C., considering that a vaporization temperature of the oxydianiline is 188° C. and a vaporization temperature of the pyromellitic dianhydride is 203° C.

Also, by passing through the processes as shown in FIG. 6, in a state shown in FIG. 6(c), a film of polyamic acid is formed due to a surface reaction between the oxydianiline and the pyromellitic dianhydride, and in a state shown in FIG. 6(d), the boat 12 is heated to a temperature of, for example, 200° C., to cause an imidization reaction, thereby forming a polyimide film.

Also, in the present embodiment, instead of the film forming apparatus 40 as shown in FIG. 5, any of the film forming apparatuses as shown in FIGS. 1 through 3 may be appropriately used. In this case, heating of the boat 12 (thermal polymerization reaction) may be performed by, for example, the internal heater 13.

(Embodiment 5)

In the present embodiment, the application of an organic film obtained by using the film forming apparatuses and the film forming methods described in the above embodiments will be explained.

Figure 7:
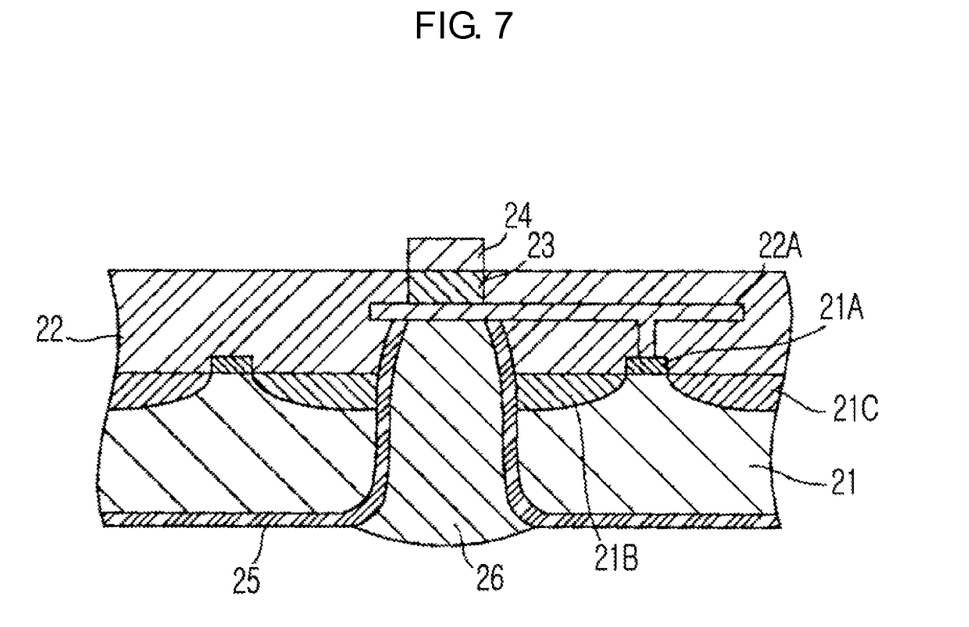
FIG. 7 is an enlarged view showing a part of a three-dimensional semiconductor integrated circuit.

FIG. 7 is an enlarged view of a part of a 3-dimensional semiconductor integrated circuit. Also, in an actual 3-dimensional semiconductor integrated circuit, elements as shown in FIG. 7 extend in a horizontal direction and are stacked in a vertical direction.

In the 3-dimensional semiconductor integrated circuit shown in FIG. 7, a gate electrode 21A is formed on a silicon substrate 21, and a source region 21B and a drain region 21C are formed on both sides of the gate electrode 21A. Also, an insulating layer 22 is formed on the silicon substrate 21 to bury the gate electrode 21A therein, and a wiring layer 23 formed of nickel or the like, and a wiring layer 24 formed of a metal are formed around a surface of the insulating layer 22.

Also, an additional wiring layer 22A formed of aluminum or the like is formed to be buried in insulating layer 22, so that the gate electrode 21A and the wiring layers 23 and 24 are electrically connected to each other.

Also, a via is formed in the silicon substrate 21 and the insulating layer 22 to reach the additional wiring layer 22A, and the organic film 25 is formed as an insulating film to cover a side wall of the via. Further, an interlayer connector (plug) 26 formed of, for example, copper or braze, is formed to be electrically connected to the additional wiring layer 22A through the organic film 25.

While an insulating film formed in the via is formed of, for example, a silicon oxide in a conventional art, an insulating film in the present embodiment is the organic film 25 as described above. Accordingly, since the insulating film may be formed at low temperature (a film forming temperature of a silicon oxide or the like is about 900° C. whereas a film forming temperature of the organic film is about 200° C.), a heat load placed on an integrated circuit assembly during a manufacturing process may be reduced. Also, in the present embodiment, a step coverage is excellent due to the film forming method, the organic film 25 may be uniformly formed in the via, and costs spent to form the insulating film may be reduced.

While the present invention has been particularly shown and described above with reference to the above specific embodiments, it will be understood that various changes in form and details may be made therein without departing from the spirit and scope of the invention.

The invention claimed is:

1. A film forming method comprising:
   supporting a plurality of substrates to be vertically spaced apart from one another in a substrate-supporting container received in a film forming container;
   supplying a material monomer toward the substrates through a supplier comprising a straight pipe portion provided vertically along the vertically spaced-apart substrates, the straight pipe portion having gas ejection holes, through which the material monomer is ejected, formed at predetermined intervals in a wall of the straight pipe portion toward the substrate-supporting container;
   heating a wall surface of the film forming container at a temperature which is equal to or higher than a vaporization temperature of the material monomer and is higher than a thermal polymerization reaction temperature by using an external heater provided outside the film forming container and along the wall surface of the film forming container to thereby prevent the material monomer from adhering to the wall surface of the film forming container;
   heating the substrates to the thermal polymerization reaction temperature of the material monomer by using an internal heater disposed inside the film forming container, and vertically along the vertically spaced-apart substrates and near the substrate-supporting container to form an organic film on the substrates through thermal polymerization; and
   holding a space between the external heater and the internal heater at a depressurized state,
   wherein the supplier is disposed between the external heater and the internal heater inside the film forming container.

2. The film forming method of claim 1, wherein a heating gas flows between the external heater and the internal heater.

3. The film forming method of claim 2, wherein the heating gas is a non-reactive gas.

4. The film forming method of claim 2, wherein the heating gas is heated to the thermal polymerization reaction temperature.

5. The film forming method of claim 1, wherein the substrate comprises a substrate for forming the organic film, and a support substrate attached to a rear surface of the substrate for forming the organic film,
   wherein the organic film is formed on a surface of the substrate for forming the organic film.

6. The film forming method of claim 1, wherein the supplier comprises
   a first gas introduction pipe which is a straight pipe erected upward from a downside and having a closed front end, and which comprises gas ejection holes, through which the material monomer is ejected, formed at predetermined intervals in a pipe wall of the first gas introduction pipe; and
   a second gas introduction pipe which is a U-shaped pipe bent downward from an upside and having a closed front end, and which comprises gas ejection holes, through which the material monomer is ejected, formed at predetermined intervals in a pipe wall of a portion bent downward in the second gas introduction pipe,
   wherein the amount of the material monomer supplied to the substrates is uniform over the surfaces of the substrates.

7. The film forming method of claim 1, wherein the organic film constitutes a through via film in a semiconductor integrated circuit.

* * * * *